United States Patent [19]

Pedersen

[11] 4,156,246
[45] May 22, 1979

[54] COMBINED OHMIC AND SCHOTTKY OUTPUT TRANSISTORS FOR LOGIC CIRCUIT

[75] Inventor: Richard A. Pedersen, New Tripoli, Pa.

[73] Assignee: Bell Telephone Laboratories, Incorporated, Murray Hill, N.J.

[21] Appl. No.: 800,282

[22] Filed: May 25, 1977

[51] Int. Cl.² .................. H01L 27/04; H01L 29/56
[52] U.S. Cl. ..................................... 357/15; 357/44; 357/46; 357/86; 357/92
[58] Field of Search .................. 357/15, 44, 46, 86, 357/92

[56] References Cited

U.S. PATENT DOCUMENTS

| 3,938,243 | 2/1976 | Rosvold | 357/15 |
| 4,075,039 | 2/1978 | Sloan | 357/92 |

FOREIGN PATENT DOCUMENTS 2431011  1/1975  Fed. Rep. of Germany ............. 357/15

OTHER PUBLICATIONS

Hewlett, "Schottky I²L", IEEE J. of Solid State Circuits, vol. SC10, No. 5, Oct. 1975, pp. 343–348.

Primary Examiner—William D. Larkins
Attorney, Agent, or Firm—H. W. Lockhart

[57] ABSTRACT

A silicon semiconductor integrated logic circuit of the injection or merged transistor logic type has output contacts in which ohmic and Schottky barrier portions are combined. A portion of the surface region of each output transistor collector is converted to more heavily doped N-type conductivity so that a metal contact applied thereto makes low resistance contact to the more heavily doped portions but forms a contact of the Schottky barrier type to the more lightly doped portion. The effect of the Schottky contact portion is to control minority carrier storage in the collector of the NPN output transistor by forcing the hole excess density at the Schottky portion surface to be zero thereby enabling short propagation delay time.

1 Claim, 2 Drawing Figures

COMBINED OHMIC AND SCHOTTKY OUTPUT TRANSISTORS FOR LOGIC CIRCUIT

BACKGROUND OF THE INVENTION

This invention relates to semiconductor integrated circuit devices and more particularly to an output contact arrangement for integrated logic circuit devices.

Integrated injection logic, also known as merged transistor logic, is a well-known form of logic device as embodied in semiconductor bipolar integrated circuits. The basic logic unit as originally proposed and implemented comprises an inverter implemented as a multicollector NPN transistor. Base drive is supplied by injection from the emitter of a lateral PNP transistor whose collector is merged with the base of the NPN transistor. The PNP transistor may be of the vertical type in the configuration referred to as substrate fed logic. However, in any of the variations, the collector of the PNP and the base of the NPN and the base of the PNP and emitter of the NPN are merged. Logic functions are obtained by direct coupling of transistors.

In a particular form of integrated injection logic termed Schottky I$^2$L, Schottky diodes are provided in series with the collector output or outputs. These diodes have the effect both of reducing the signal swing and reducing the downward, inverse, current gain. The former improves the power-delay efficiency and the latter the intrinsic speed limit.

However, although the Schottky I$^2$L configuration is highly advantageous where the outputs are connected to other I$^2$L units to form logic arrays, it is disadvantageous when the output connects to other non-logic circuitry. In particular, the Schottky output has a high saturation voltage comprised of the voltage drop across the Schottky junction in addition to the intrinsic saturation voltage of the NPN transistor. Accordingly, output transistors normally have conventional ohmic, or low resistance, contacts to the collector thereby providing a low saturation voltage by virtue of the low resistance contact and the high downward, inverse, current gain. However, such output transistors with these characteristics suffer longer carrier storage delay times, thus limiting circuit speed.

Thus, an object of this invention is an output configuration having a desirably low output saturation voltage combined with minimal minority carrier storage to provide advantageously short signal propagation delays.

SUMMARY OF THE INVENTION

In one embodiment in accordance with this invention contact to the collector zone of the output transistor of an injection logic device comprises a combination of an ohmic, low resistance portion and a Schottky barrier portion. In particular, the collector zone of the output transistor comprises a portion of relatively lightly doped N-type conductivity having a net impurity concentration such that the contact forming material applied thereto forms a Schottky barrier connection. However, within a portion of the lightly doped collector zone, and contiguous with the surface thereof, there is formed a more heavily doped N+ type conductivity zone. The contact forming material overlays this N+ zone forming a low resistance or ohmic contact thereto. Thus, the electrical output connection enjoys both a lower saturation voltage by virtue of the ohmic contact portion and, at the same time, improved switching speed because the Schottky contact portion forces the minority carrier (hole) excess sensity to zero in that portion.

BRIEF DESCRIPTION OF THE DRAWING

The invention and its other objects and features will be more clearly understood from the following detailed description taken in conjunction with the drawing in which.

DETAILED DESCRIPTION

Figure 1:
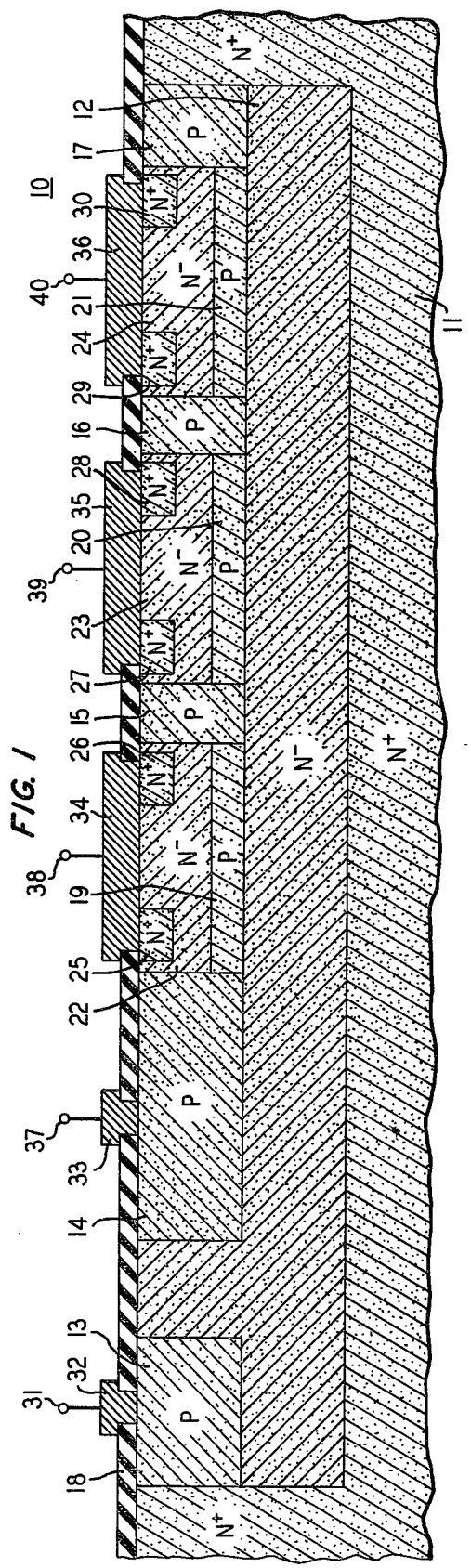
FIG. 1 is a cross-sectional view of a portion of a semiconductor-integrated circuit device including a merged transistor logic portion in accordance with the invention.

An illustrative embodiment of the invention is shown in FIG. 1 in which the semiconductor body 10 is a portion of a silicon integrated circuit device. The N+ conductivity type portion 11 is a part of the original material of the chip within which the logic and other units of the integrated circuit are formed. In this embodiment three output connections are shown for illustrative purposes although in most cases only a single output, connecting off the chip or to other non-logic circuits on the same chip, is used. Referring also to the circuit schematic of FIG. 2 the logic unit comprises the NPN inverter or output transistor 41 and the PNP current source transistor 42. Output transistor 41 is shown having multiple collectors leading to three output terminals 47, 48 and 49. Terminal 50 connected to the emitter of current source transistor 42 is termed the injector and terminal 43 is the logical input terminal.

As is known, binary information is determined by the path taken by current out of the collector of transistor 42 at node 51, which is a function of the relative voltage at input terminal 43.

Figure 2:
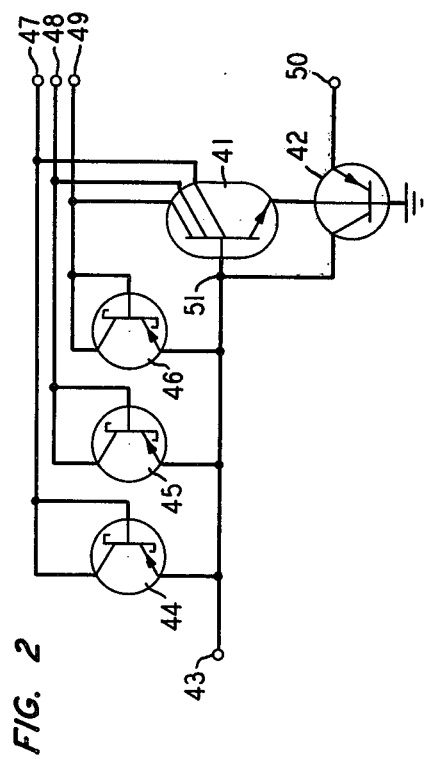
FIG. 2 is a circuit schematic of the merged transistor logic unit of FIG. 1.

As can be seen from the schematic drawing of FIG. 2, the emitter of output transistor 41 is merged with the base of transistor 42 and is constituted by the N− zone 12 of FIG. 1. The collector of transistor 42 likewise is merged with the base of transistor 41 and is constituted by the plurality of P-type zones 14, 15, 16, 17, 19, 20 and 21. P-type zone 13 is the emitter zone of transistor 42 and terminal 31 is the injector. The multiple collector zones of the output transistor 41 are constituted by the N− zones 22, 23, and 24 and the N+ zones 25 through 30. Although shown in this cross-section view as a pair of N+ zones within each N− zone the N+ zone may be a single zone comprised of a continuous, closed figure encompassing a portion of the N− zones 22, 23, and 24 of the collector.

The N+ zones 25 through 30 are of considerably lesser depth from the surface of the semiconductor body portion than the N− zones 22, 23 and 24 of the collector. In a typical embodiment the N− zones have a net impurity concentration of from $1-5 \times 10^{16}$ atoms/cc and, in any case, for the formation of the desired contact characteristics the net impurity concentration should not exceed about $1 \times 10^{17}$ atoms/cc. Typically, the N+ portions of the collector have a net impurity concentration of at least about $1 \times 10^{19}$ atoms/cc in order to assure formation of low resistance electrical contact thereto.

Electrical contact to the semiconductor device is provided by the metallic layer portions 32, 33, 34, 35 and 36 each of which is defined in area by the silicon oxide film 18 on the major surface of the body. In a specific embodiment, the metallic contacts comprise multiple layers including, from the silicon surface outward, platinum silicide, titanium, platinum or palladium, and finally gold. Other metal systems or single metals may also be used including in particular, aluminum, as well as other metals currently in use for semiconductor contacts.

Importantly, from the standpoint of this invention, the metal contact arrangement is such that collector output contacts 34, 35 and 36 produce a combination contact in which the portions which overlay N+ zones are ohmic, low resistance contacts and the remaining portions in contact with N− zones form Schottky type contacts. The Schottky barrier contact portions have the effect of forcing the excess minority carrier density, in this case hole density, at the N− zone surface, to zero by providing a minority carrier recombination surface. Thus, there is formed, in effect, a PNP transistor having a Schottky collector shorted to its base by way of the common contact to the N+ zone and the Schottky barrier. As shown in FIG. 2, the PNP Schottky transistors 44, 45 and 46 are each connected in parallel with one of the multiple base-collector junctions of output transistor 41. With this configuration the output transistors enjoy the relatively low saturation voltage provided by the ohmic contact portion of the collector output connection while at the same time the PNP Schottky transistor remains in the active region of operation and hence keeps the excess hole density at the Schottky surface at zero. Accordingly, the combination exhibits reduced minority carrier storage delay and enhanced switching speed.

In a particular embodiment, the degree to which the advantageous characteristics referred to above are provided is, to a considerable extent, a function of the relative areas of the ohmic and Schottky contact portions. In a typical embodiment the ratio of areas of the ohmic (N+) to Schottky (N−) contact portions may be about one to four.

Fabrication of the logic unit illustrated in FIG. 1 follows techniques presently well known in the art. In one embodiment the N− zone 12 and zones therewithin may be constituted by epitaxial deposition on an original semiconductor wafer of N+ conductivity. The intermediate P-type zones 19, 20 and 21 advantageously are formed subsequently by ion implantation and in such an arrangement the N− conductivity type zones will usually be of uniform impurity distribution. However, such form of distribution is not essential and these, as well as other zones, may be formed by diffusion providing, usually, a graded concentration distribution.

The N+ collector zones 25 through 30 are shown as being wholly within the N− collector and therefore spaced away from the adjoining P-type conductivity zones 14 through 17. This arrangement precludes the possibility of unwanted tunneling which can occur if the P-type zone is of relatively high conductivity. Such spacing may not be necessary if the P-type zones are of lower conductivity. In addition, it is significant that each metal contact 34, 35 and 36 is in contact only with the N-type collector zones.

Referring further to both figures of the drawing, injector contact 31 corresponds to terminal 50, input contact 37 to terminal 43, and output contacts 38, 39 and 40 to terminals 47, 48 and 49. The ground connection to the N-type substrate is not depicted.

What is claimed is:

1. A semiconductor integrated circuit device of the merged transistor logic type in which the output transistor is of the NPN type comprising a body of semiconductor material having a major surface, a first zone of N-type conductivity in a portion of said body contiguous with a portion of said major surface and constituting the collector zone of said output transistor, said first zone having a net impurity concentration of $1-5 \times 10^{16}$ atoms/cc, a second zone of N-type conductivity within said first zone and contiguous with a portion of said major surface, said second zone having a net impurity concentration greater than $10^{19}$ atoms/cc, and having a lesser depth from said major surface than said first zone, the area of said first zone portion contiguous with said major surface being about four times the area of said second zone contiguous with said major surface, and a metallic layer, selected from the group consisting of platinum silicide and aluminum, on said major surface only on the portions contiguous with said first and second zones.

* * * * *